(12) United States Patent
Lee et al.

(10) Patent No.: US 6,770,415 B2
(45) Date of Patent: Aug. 3, 2004

(54) PHOTORESIST POLYMER FOR TOP-SURFACE IMAGING PROCESS BY SILYLATION AND PHOTORESIST COMPOSITION CONTAINING THE SAME

(75) Inventors: Geun Su Lee, Kyoungki-do (KR); Cha Won Koh, Seoul (KR); Jae Chang Jung, Kyoungki-do (KR); Min Ho Jung, Kyoungki-do (KR); Ki Ho Baik, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 09/884,313

(22) Filed: Jun. 19, 2001

(65) Prior Publication Data

US 2002/0061461 A1 May 23, 2002

(30) Foreign Application Priority Data

Jun. 21, 2000 (KR) ........................................ 2000-34103

(51) Int. Cl.[7] .............................................. G03F 7/038
(52) U.S. Cl. .................... 430/270.1; 430/296; 430/905; 430/909; 430/910
(58) Field of Search .............................. 430/270.1, 905, 430/909, 910, 311, 296, 330

(56) References Cited

U.S. PATENT DOCUMENTS

| 6,159,655 | A | * | 12/2000 | Sato .......................... 430/270.1 |
| 6,303,725 | B1 | * | 10/2001 | Chang et al. ................ 526/266 |
| 2002/0018960 | A1 | * | 2/2002 | Lee et al. ................. 430/270.1 |

FOREIGN PATENT DOCUMENTS

| EP | 0 989 458 A2 | 3/2000 |
| EP | 0 989 458 A3 | 5/2000 |
| GB | 2 340 831 A | 3/2000 |
| GB | 2 345 285 A | 7/2000 |
| JP | 2000-080124 | 3/2000 |

OTHER PUBLICATIONS

United Kingdom Search Report dated Sep. 25, 2001.

* cited by examiner

Primary Examiner—Yvette C. Thornton
(74) Attorney, Agent, or Firm—Marshall, Gerstein & Borun LLP

(57) ABSTRACT

A photoresist polymer for a top-surface imaging process by silylation (TIPS), and a photoresist composition comprising the same. The protecting group of the present photoresist polymer is selectively protected in an exposed region, and thus a hydroxyl group is generated. The hydroxyl group reacts with the silylation agent to cause a silylation process. Accordingly, when the photoresist film is dry-developed, the exposed region only remains to form a negative pattern. In addition, the present photoresist composition has excellent adhesiveness to a substrate, thus preventing a pattern collapse in forming a minute pattern. As a result, the present photoresist composition is suitable for a lithography process using light sources such as ArF (193 nm), VUV (157 nm) and EUV (13 nm).

Formula 1

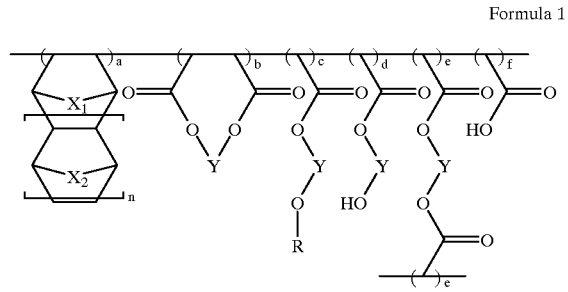

9 Claims, 4 Drawing Sheets

PHOTORESIST POLYMER FOR TOP-SURFACE IMAGING PROCESS BY SILYLATION AND PHOTORESIST COMPOSITION CONTAINING THE SAME

BACKGROUND

1. Technical Field

A photoresist polymer for a top-surface imaging process by silylation (TIPS), and a photoresist composition containing the same. In particular, a photoresist polymer which can perform a silylation process by selectively providing protecting group in an exposed region to generate a hydroxyl group, and by reacting the hydroxyl group with a silylation agent, and a photoresist composition containing the same.

2. Description of the Background Art

Thin layer imaging technologies such as TIPS are effective patterning processes for photolithography using a wavelength below 193 nm and optical lithography using an extreme ultraviolet (EUV) wavelength (e.g., 13 nm).

Some of the known limitations of the photolithography include substrate's influence on the light (e.g., reflection, scattering, diffraction, etc.), notching, standing wave effect, pattern collapse, non-uniformity of a critical dimension (CD), isolated and grouped bias (IG bias) and the like. In TIPS, a shallow exposure is performed which forms a latent image by diffusion of acids that is generated in the exposed region. The exposed region is then selectively silylated with a silylating agent. The silylated region serves as a mask, and the non-silylated region is dry-etched by 02 plasma. Thus, TIPS requires photoresist compositions having a high energy absorption coefficient and process conditions that have high selectivity in etching non-silylated regions during $O_2$ plasma treatment.

TIPS is rarely influenced by substrates and topology. In addition, TIPS is less sensitive to transparency, adhesiveness and etching selection ratio of the photoresist composition. TIPS also has a much wider depth of focus in high resolution than a single layer resist (SLR). Thus, in some aspects, TIPS has more advantages than a general resist patterning process.

In addition, compared with a wet development of SLR, the dry development process of TIPS can be applied to a thick resist process in a high aspect ratio without causing a pattern to collapse. This advantage is useful on a substrate having a relatively low etching selection ratio, such as an oxide or metal. As a result, TIPS is recognized as an alternative to SLR.

SUMMARY OF THE DISCLOSURE

A photoresist (PR) polymer for top-surface imaging process by silylation (TIPS) using a light source such as KrF, ArF, VUW, EUV and E-beam, and process for preparing thereof are disclosed.

A photoresist composition comprising the PR polymers described above is also disclosed.

A semiconductor element produced by using the disclosed photoresist composition is also disclosed.

DETAILED DESCRIPTION OF THE PRESENTLY PREFERRED EMBODIMENTS

Figure 1:
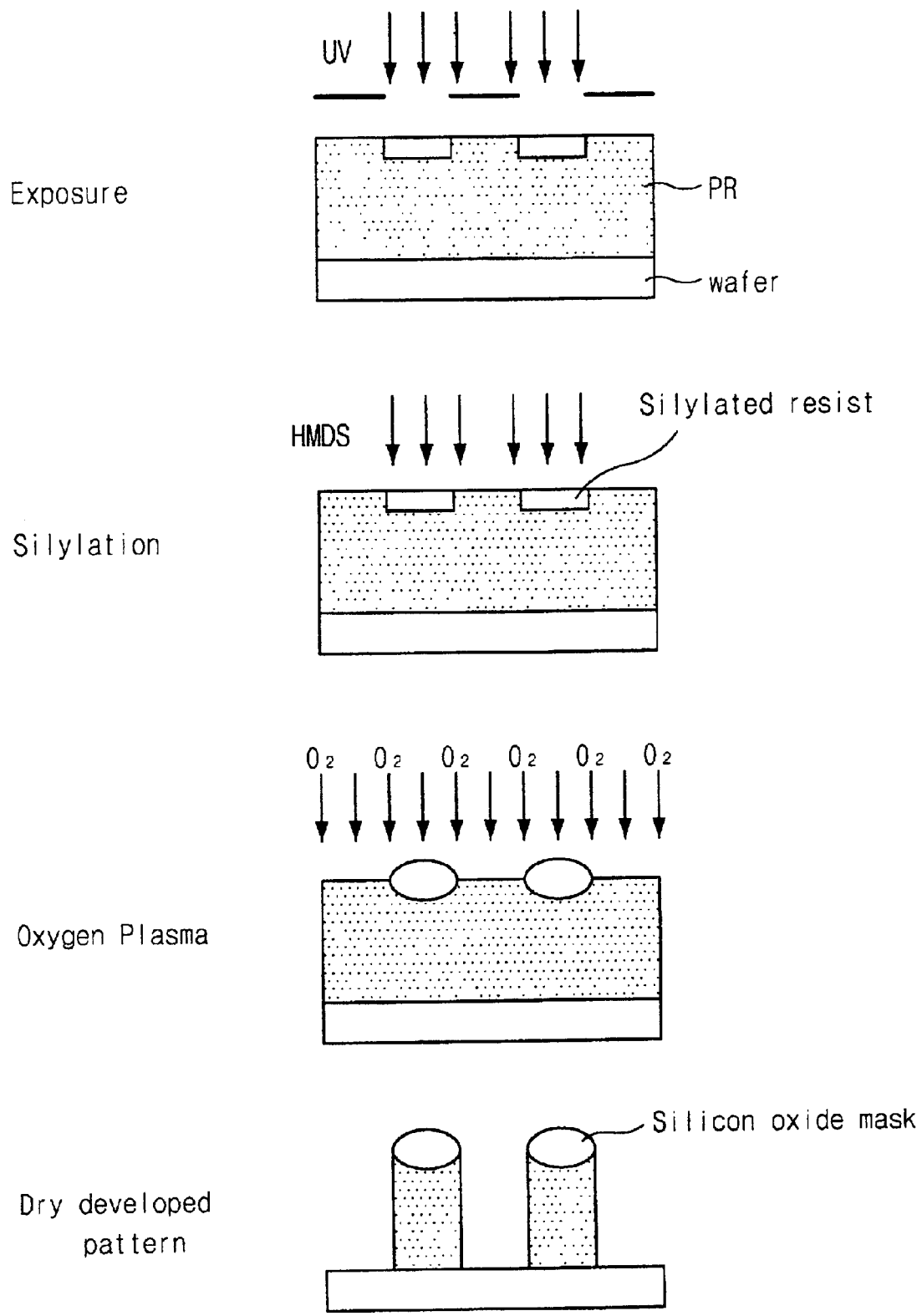
FIG. 1 is a schematic view illustrating TIPS in accordance with the present invention.

A photoresist polymer having a repeating unit for a top-surface imaging process by silylation (TIPS) is disclosed below. In one aspect, the repeating unit is represented by following Formula 1:

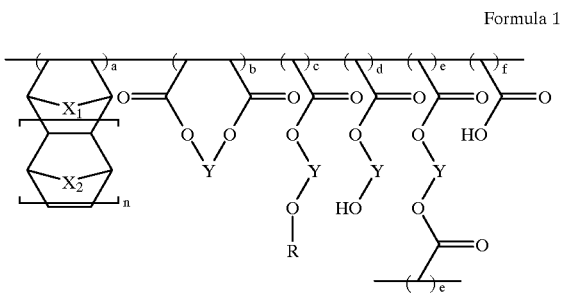

Formula 1 wherein, $X_1$ and $X_2$ are independently $CH_2$, $CH_2CH_2$, O or S;

Y is linear or branched ($C_1$—$C_{10}$) alkylene, or alkylene comprising an ether linkage;

R is an acid labile protecting group;

n is an integer from 0 to 2; and a: b: c: d: e: f is 20–40 mol %:0–20 mol %:20–70 mol %:0–30 mol %:0–20 mol %:0–20 mol %.

The acid labile protecting group can be any of the known protective groups that can be substituted by an acid and functions to prevent the compound to which the group is bound from dissolving in the alkaline developer solution. Conventional acid labile protecting groups are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0789 278 (Aug. 13, 1997) and U.S. Pat. No. 6,132,926 (Oct. 17, 2000). Preferable acid labile protecting groups are selected from the group consisting of tert-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, tert-butoxyethyl, 1-isobutoxyethyl and 2-acetylmenth-1-yl.

It is preferable that n is O, X is $CH_2$, Y is $CH_2CH_2$ or $CH_2CH_2OCH_2CH_2$, and R is tert-butyl.

The repeating unit of Formula 1 can be prepared by a process comprising the steps of:

(a) polymerizing compound of Formula 5 with maleic anhydride to obtain a polymer of the following Formula 2;

(b) reacting the polymer of Formula 2 with diol compound of following Formula 4 to obtain a polymer of following Formula 3; and (c) reacting the polymer of Formula 3 with a compound having an acid labile protecting group to obtain a polymer of Formula 1 where a hydroxyl group is partially protected.

Formula 2

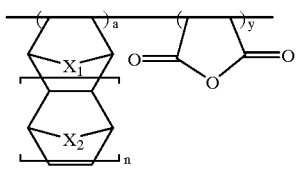

Formula 3

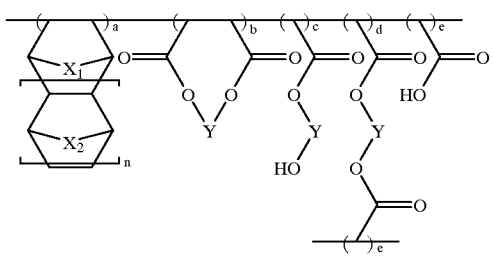

OH—Y—OH  Formula 4

Formula 5

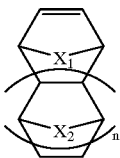

wherein, $X_1$ and $X_2$ are independently $CH_2$, $CH_2CH_2$, O or S;

Y is linear or branched ($C_1$–$C_{10}$) alkylene, or alkylene having an ether linkage;

n is an integer from 0 to 2;

in Formula 2, x:y is 20–40 mol %:60–80 mol %; and in Formula 3, a:b:c:e:f is 20–40 mol %:0–20 mol %:20–80 mol %:0–20 mol %:0–20 mol %.

In above step (a), polymerization is preferably carried out in a conventional organic solvent, some of which are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0789 278 (Aug. 13, 1997) and U.S. Pat. No. 6,132,926 (Oct. 17, 2000), more preferably selected from the group consisting of tetrahydrofuran, dimethylformamide, dimethylsulfoxide, dioxane, benzene, toluene, xylene, propylene glycol methyl ether acetate and ethyl lactate. In addition, a solvent for crystallizing and purifying the polymer is preferably selected from the group consisting of diethyl ether, petroleum ether, lower alcohol such as methanol, ethanol and isopropanol, water, and mixtures thereof.

The preparation process for the polymer of Formula 1 is represented in following Reaction Scheme 1. However, Reaction Scheme 1 relates merely to the polymer of Formula 1 wherein n is 0.

Reaction Scheme 1

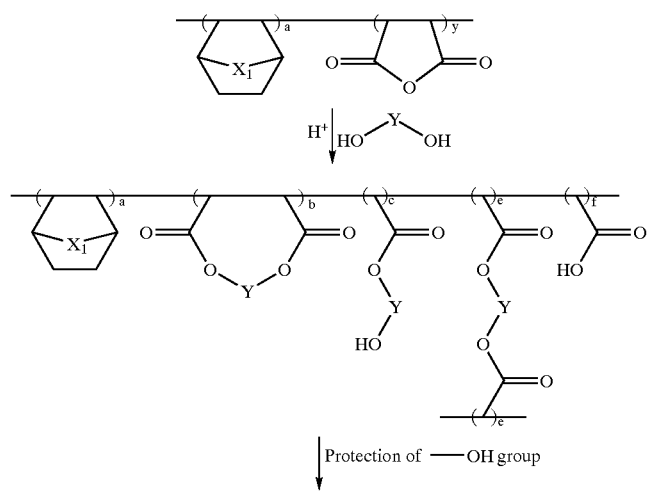

-continued

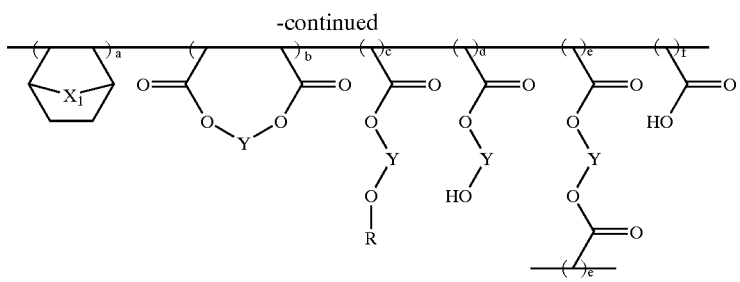

wherein, the compound having the protecting group preferably comprises the compound having the group of tert-butylcarboxylate, ($C_1$–$C_{20}$) alkyl, ($C_1$–$C_{20}$) aryl or ($C_1$–$C_{20}$) arylvinylether; and the protecting group is preferably selected from the group consisting of tert-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, tert-butoxyethyl, 1-isobutoxyethyl and 2-acetylment-1-yl.

Another aspect is to provide a polymer of the above Formula 3 which is used as an intermediate for preparing the photoresist polymer of Formula 1.

In addition, a photoresist composition comprising (i) the photoresist polymer of Formula 1; (ii) a photoacid generator; and (iii) an organic solvent is also disclosed.

Any of known photoacid generator, which is able to generate acids by light, can be used in PR composition of the present invention. Conventional photoacid generators are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0789 278 (Aug 13, 1997) and U.S. Pat. No. 6,132,926 (Oct. 17, 2000).

Preferred photoacid generators have a relatively low light absorbency in the wavelengths of 157 nm and 193 nm. More preferably, the photoacid generator is selected from the group consisting of phthalimidotrifluoromethane sulfonate, dinitrobenzyltosylate, n-decyl disulfone and naphthylimido trifluoromethane sulfonate.

The photoacid generator can further comprise a compound selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, triphenylsulfonium hexafluoroarsenate, triphenylsulfonium hexafluoroantimonate, triphenylsulfonium triflate and dibutylnaphthylsulfonium triflate.

The photoacid generator is used in an amount of 0.1 to 10 wt. % of the photoresist resin employed.

Organic solvent can be any of known solvent disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0789 278 (Aug. 13, 1997) and U.S. Pat. No. 6,132,926 (Oct. 17, 2000).

Exemplary organic solvents suitable in PR compositions of the present invention include ethyl 3-ethoxypriopionate, methyl 3-methoxypropionate, cyclohexanone, propyleneglycol methyl ether acetate, n-heptanone and ethyl lactate.

The amount of solvent used is preferably in the range of from about 300% to about 1500% by weight of the PR polymer. This ratio has been found to be particularly useful in obtaining a photoresist layer of a desirable thickness when coated on to a suitable substrate such as a silicon wafer in production of a semiconductor element. In particular, it has been found by the present inventors that when the amount of organic solvent is about 800% by weight of the photoresist polymer, a photoresist composition layer having 0.3 µm of thickness can be obtained.

Yet another aspect is to provide a process for forming a photoresist pattern, as shown in FIG. 1, comprising the steps of:

(a) coating a photoresist composition on a substrate of a semiconductor element to form a photoresist film;

(b) selectively exposing said photoresist film using a light source (see the first drawing in FIG. 1);

(c) applying silylating agent to the resultant to produce a silylated layer on the exposed portion of said exposed photoresist film (see the second drawing in FIG. 1); and (d) etching the non-exposed portion photoresist film using the silylated layer as an etching mask (see the third and fourth drawings in FIG. 1).

The substrate is preferably pre-treated with hexamethyldisilazane [HMDS: $(CH_3)_3Si$-NH-$Si(CH_3)_3$] before step (a). The pre-treatment improves adhesiveness between the substrate and the photoresist composition.

In the exposure step, a light penetrating through the exposure mask selectively generates a photochemical reaction of the photoresist merely in the exposed region, thus maintaining overlay accuracy with a previously-formed pattern.

The process for forming the photoresist pattern can further include a baking step before and/or after exposure of step (b). Preferably, the baking step is performed at temperature ranging from about 70 to about 200° C. The soft baking step before exposure transforms the photoresist composition into a solid-type resist film by evaporating from about 80 to about 90% of the solvent in the photoresist composition.

A pre-silylation baking (PSB) step is performed after the exposure. The pre-silylation baking step causes a difference in solubility due to a chemical reaction which takes place between the photoresist resin and acids ($H^+$) generated by exposure. That is, the protecting group of the photoresist polymer is deprotected in the PSB step, and thus the hydroxyl group is selectively generated in the exposed section. Accordingly, the silylation is mainly performed in the exposed region, and thus a negative pattern is formed after dry-etching.

Exemplary light sources which are useful for forming the PR pattern include ArF, KrF, VUV, EUV, E-beam, X-ray and ion beam. The irradiation energy is preferably in the range of from about 1 to about 50 mJ/cm$^2$.

The silylation agent for the silylation process is preferably selected from the group consisting of hexamethyldisilazane (HMDS), tetramethyldisilazane (TMDS), bis(dimethyl amino)dimethyl silane, bis(dimethyl amino)methyl silane [B(DMA)MS], dimethylsilyl dimethylamine, dimethylsilyl diethylamine, trimethylsilyl dimethylamine, trimethylsilyl diethylamine and dimethylamino pentamethyldisilane. The silylation agent can be employed in a liquid phase or, preferably, in a gas phase.

In the silylation process, it is believed that the silylating agent diffuses and penetrates into the photoresist resin. The hydroxyl group present in the photoresist resin reacts with the silylating agent to form a silicon-oxygen bond. When thermal energy or moisture ($H_2O$) is added, the silylating agent diffuses out easily. Therefore the silylation and dry development processes are preferably performed in a single chamber.

In another embodiment, a semiconductor element that is manufactured using the photoresist composition described above.

The present invention will now be described in more detail by referring to the examples below, which are not intended to be limiting.

I. Preparation of Photoresist Polymer

EXAMPLE 1

(Step 1) Synthesis of Poly(norbomene/maleic anhydride)

To 50 ml of tetrahydrofuran was added 0.2 mole of norbomylene, 0.2 mole of maleic anhydride and 0.4 g of AIBN. The resulting mixture was reacted at 67° C. for 24 hours. Thereafter, the polymer was precipitated and filtered in petroleum ether/ether (1/1) solution, to obtain poly (norbomene/maleic anhydride) of Formula 2 wherein n is 0 and $X_1$ is $CH_2$ (yield:65%).

(Step 2) Synthesis of Poly(norbornene/dihydroxyethylfumalate)

To 300 ml of anhydrous ethylene glycol (HO—$CH_2CH_2$—OH) was added 19.2 g of poly(norbomene/maleic anhydride) prepared in step 1, and 0.1 ml of sulfuric acid. The resulting mixture was reacted at 150° C. for 10 hours. After cooling the resulting solution, 100 ml of water was added thereto. Thereafter, the esterized polymer was precipitated, filtered and dried, to obtain poly(norbomene/dihydroxyethylfumalate) of Formula 3 wherein n is 0, $X_1$ is $CH_2$, and Y is $CH_2CH_2$ (yield:96%).

(Step 3) Protection of Hydroxyl Group

To 50 ml of dimethylformamide was added 10 g of compound prepared in Step 2, and 20 g of di-tert-butyldicarbonate, and the resulting mixture was reacted at a room temperature for 12 hours. Thereafter, the polymer was precipitated and purified in hexane, to obtain the polymer of Formula 1 wherein n is 0, $X_1$ is $CH_2$, Y is $CH_2CH_2$, and R is tert-butyl (yield:97%).

EXAMPLE 2

(Step 1) Synthesis of Poly(norbomene/dihydroxyethoxyethylfumalate)

To 300 ml of anhydrous diethylene glycol (HO—$CH_2CH_2OCH_2CH_2$—OH) was added 19.2 g of poly (norbomene/maleic anhydride) prepared in Step 1 of Example 1, and 0.1 ml of sulfuric acid, and the resulting solution was reacted at 150°C. for 10 hours. Thereafter, the resulting solution was cooled, and 100 ml of water was added thereto. The esterized polymer was precipitated, filtered and dried, to obtain poly(norbornene/dihydroxyethoxyethylfumalate) of Formula 3 wherein n is 0, $X_1$ is $CH_2$, and Y is $CH_2CH_2OCH_2CH_2$ (yield: 94%).

(Step 2) Protection of Hydroxyl Group

To 50 ml of dimethylformamide was added 10 g of compound prepared in step 1 of Example 2, and 20 g of di-tert-butyldicarbonate, and the resulting solution was reacted at a room temperature for 12 hours. Thereafter, the polymer was precipitated and purified in hexane, to obtain the polymer of Formula 1 wherein n is 0, $X_1$ is $CH_2$, Y is $CH_2CH_2OCH_2CH_2$, and R is tert-butyl (yield:97%).

II. Preparation of Photoresist Compositions and Formation of Patterns

EXAMPLE 3

To 100 g of propyleneglycol methyl ether acetate was added the polymer prepared in Example 1 (10 g), phthalimidotrifluoromethane sulfonate (0.06 g) and triphenylsulfonium triflate (0.06 g). The resulting mixture was stirred and filtered through 0.20 µm filter to obtain a photoresist composition.

Figure 2:
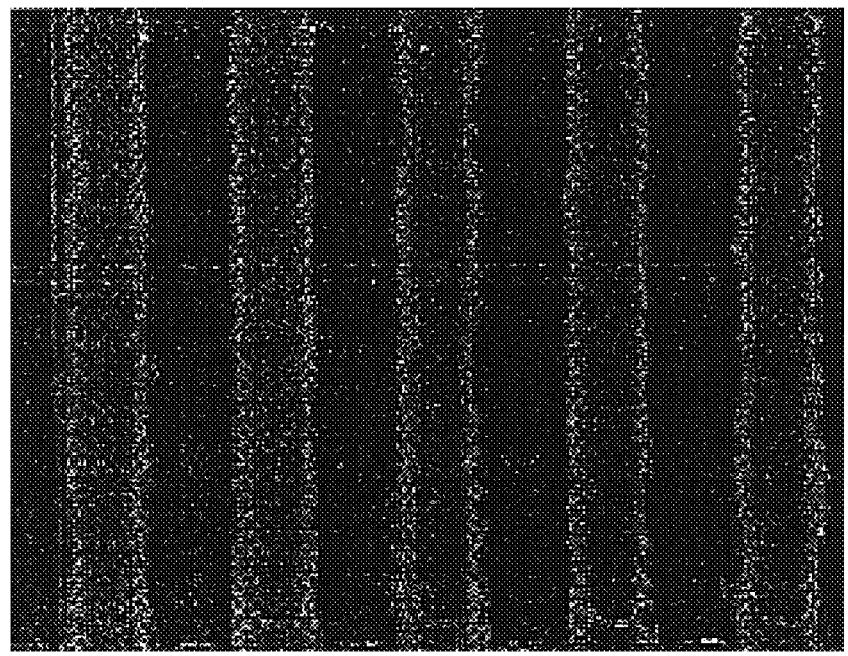
FIG. 2 shows a pattern obtained in Example 3.

The photoresist composition was coated on a silicon wafer to form a photoresist thin film. The thin film was soft-baked in an oven or hot plate at 130° C. for 90 seconds, exposed to light using an ArF exposer, post-baked at 130° C. for 90 seconds, and developed in the 2.38 wt. % aqueous TMAH solution to obtain 110 nm L/S pattern (see FIG. 2).

EXAMPLE 4

To propyleneglycol methyl ethyl acetate (10 g) was added the polymer prepared in Example 1(10 g), phthalimidotrifluoromethane sulfonate (0.06 g) and triphenylsulfonium triflate (0.06 g). The resulting solution was filtered through 0.20 µm filter to obtain a photoresist composition.

Figure 3:
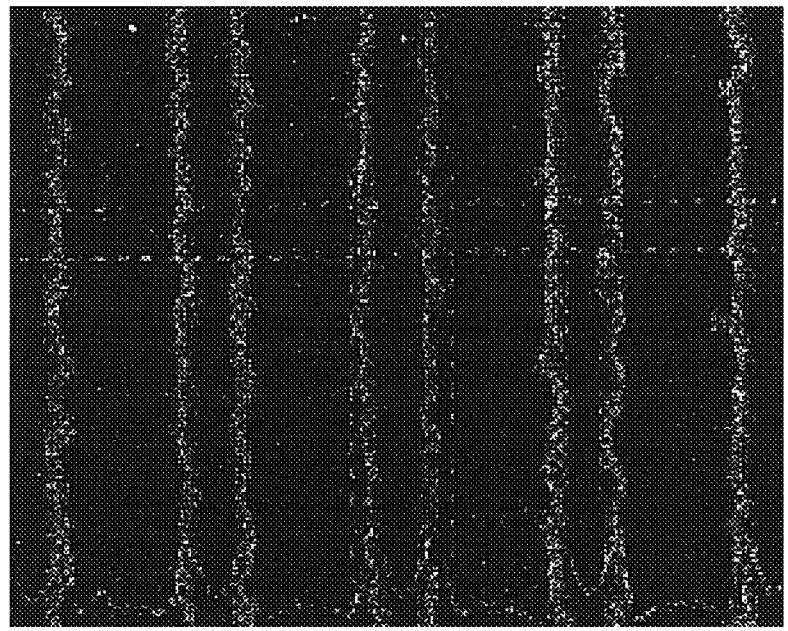
FIG. 3 shows a pattern obtained in Example 4.

In order to evaluate the L/S pattern by the TIPS, the photoresist composition was spin-coated on a bare silicon wafer at a thickness of about 3000 Å, and soft-baked at 100° C. for 60 seconds. After baking, the photoresist was exposed to light by using ISI ArF stepper (NA=0.6, Off-axis). Thereafter, the silylation was performed thereon at 100° C. for 210 seconds by using gas-phase tetramethyldisilazane. On the other hand, the dry development included breakthrough for removing silicon dioxide layer in the exposed region; oxygen plasma etching and over-etching for etching a resist. The dry development was performed under the conditions of 35 sccm$O_2$, 500 W of top power, 100 W of bottom power, 75 W of bias, −30° C. and 5 mtorr. After the dry development, 110 nm L/S pattern was obtained (see FIG. 3).

EXAMPLE 5

To propyleneglycol methyl ethyl acetate (100 g) was added the polymer prepared in Example 2 (10 g), phthalimidotrifluoromethane sulfonate (0.06 g) and triphenylsulfonium triflate (0.06 g). The resulting solution was filtered through 0.20 µm filter to obtain a photoresist composition.

Figure 4:
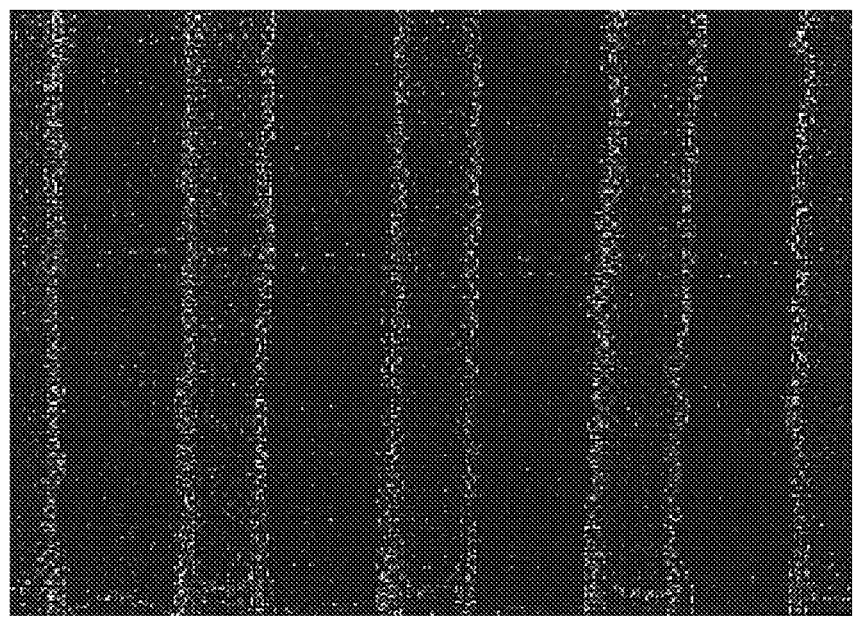
FIG. 4 shows a pattern obtained in Example 5.

The procedure of Example 4 was repeated on the thusly-prepared photoresist composition, to obtain a 110 nm L/S pattern (see FIG. 4).

As discussed earlier, the photoresist composition can be used for the TIPS employing KrF, ArF, VUV (157 nm), EUV (13 nm) or E-beam as a light source.

Moreover, the photoresist composition has excellent resolution and adhesiveness, and thus can prevent a pattern collapse in forming a minute pattern.

What is claimed:

1. A photoresist polymer comprising a repeating unit of following formula 1;

Formula 1

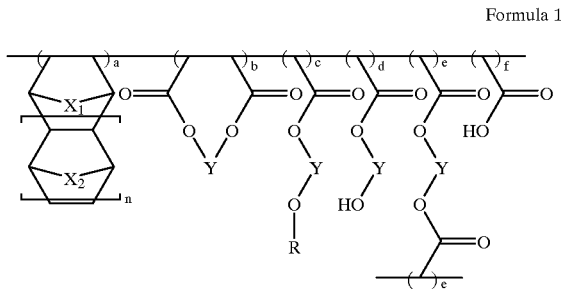

wherein, $X_1$ and $X_2$ are independently from the $CH_2$, $CH_2CH_2$, O and S;
Y is $C_1$–$C_{10}$ alkylene comprising an ether linkage;
Y is an acid labile protecting group;
R is an integer from 0 to 2; and
a:b:c:d:e:f is 20–40 mol %:present in an amount between 0 and 20 mol %: 20–70 mol %:present in an amount between 0 and 30 mol %:1 present in an amount up between 0 and 20 mol %: 0–20 mol %.

2. The photoresist polymer according to claim 1, wherein the avid labile protecting group is selected from the group consisting of tert-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methyletlayl, 1-ethoxypropyl, 1-ethoxy-1-methylethyl, 1-methoxyethyl, 1-ethoxyethyl, ten-butoxyethyl, 1-isobutoxyethyl and 2-acetylmenth-1-yl.

3. The photoresist polymer according to claim 1, wherein a is 0, $X_1$ is $CH_2$, Y is $CH_2CH_2$ or $CH_2CH_2OCH_2CH_2$, and R is tert-butyl.

4. A photoresist composition comprising (i) the photoresist polymer of claim 1, (ii) a photoacid generator; and (iii) an organic solvent.

5. The photoresist composition according to claim 4, wherein the photoacid generator is selected from the group consisting of phthalimidotrifluoxomethane sulfonate, dinitrobenxyltosylate, n-decyl disulfone, naphthylimido trifluoromethane sulfonate and mixture thereof.

6. The photoresist composition according to claim 5, wherein the photoacid generator is selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl inflate, triphenylsulfonium hexafluororphosphate, triphenylsulfonium hexafluoroansenate, triphenylsulfonium hexafluoroantimonate, triphenylsulfonium triflate, dibutyl-naphthylsulfonium triflate and mixture thereof.

7. The photoresist composition according to claim 4, wherein the photo acid generator is present in an amount ranging from about 0.1 to about 10% by weight of the photoresist polymer.

8. The photoresist composition according to claim 4, wherein the organic solvent is selected from the group consisting of ethyl 3-ethoxypropionate, methyl 3-methoxypropionate, cyclohexanone, propyleneglycol methyl ether acetate, n-heptanone, ethyl lactate end mixture thereof.

9. The photoresist composition according to claim 4, wherein an amount of organic solvent ranges from about 300% to about 1500% by weight of the photoresist polymer.

* * * * *

UNITED STATES PATENT AND TRADEMARK OFFICE
CERTIFICATE OF CORRECTION

PATENT NO. : 6,770,415 B2
DATED : August 3, 2004
INVENTOR(S) : Geun-Su Lee et al.

It is certified that error appears in the above-identified patent and that said Letters Patent is hereby corrected as shown below:

Title page,
Item [*] Notice, please insert -- This patent is subject to a terminal disclaimer --.

Column 9,
Line 3, please delete "1;" and replace with -- 1: --.
Line 18, please delete "wherein, $X_1$ and $X_2$ are independently from the" and replace with -- wherein, $X_1$ and $X_2$ are independently selected from the group consisting of --.
Line 20, please delete "comprising an ether linkage;" and replace with -- or alkylene comprising an ether linkage; --.
Line 21, please delete "Y" and replace with -- R --.
Line 22, please delete "R" and replace with -- n --.

Signed and Sealed this

Twenty-second Day of February, 2005

JON W. DUDAS
*Director of the United States Patent and Trademark Office*